United States Patent
Choi et al.

(10) Patent No.: US 9,643,850 B2
(45) Date of Patent: May 9, 2017

(54) METHOD AND APPARATUS FOR RESTORING PROPERTIES OF GRAPHENE

(71) Applicant: Samsung Electronics Co., Ltd., Suwon-si, Gyeonggi-do (KR)

(72) Inventors: Jae-young Choi, Suwon-si (KR); Wonjong Yoo, Suwon-si (KR); Yeong-dae Lim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 800 days.

(21) Appl. No.: 13/864,732

(22) Filed: Apr. 17, 2013

(65) Prior Publication Data
US 2014/0048411 A1    Feb. 20, 2014

(30) Foreign Application Priority Data

Aug. 16, 2012    (KR) .................. 10-2012-0089736

(51) Int. Cl.
| | | |
|---|---|---|
| C01B 31/04 | (2006.01) | |
| C23C 16/56 | (2006.01) | |
| B82Y 40/00 | (2011.01) | |
| H01J 37/32 | (2006.01) | |
| B82Y 30/00 | (2011.01) | |

(52) U.S. Cl.
CPC ......... *C01B 31/0484* (2013.01); *B82Y 30/00* (2013.01); *B82Y 40/00* (2013.01); *C23C 16/56* (2013.01); *H01J 37/321* (2013.01); *H01J 37/32146* (2013.01); *Y10S 977/845* (2013.01)

(58) Field of Classification Search
None
See application file for complete search history.

(56) References Cited

U.S. PATENT DOCUMENTS

| | | | | |
|---|---|---|---|---|
| 3,907,616 A | * | 9/1975 | Wiemer | ............ H01L 21/02129 148/DIG. 118 |
| 5,888,414 A | * | 3/1999 | Collins | ................. C23C 16/517 156/345.48 |

(Continued)

FOREIGN PATENT DOCUMENTS

| | | |
|---|---|---|
| JP | 2012119665 A | 6/2012 |
| KR | 20100015630 A | 2/2010 |

(Continued)

OTHER PUBLICATIONS

Yeong-Dae Lim, Si-Compatible Cleaning Process for Graphene Using Low-Density Inductively Coupled Plasma, American Chemical Society, Apr. 20, 2012, vol. 6, No. 5, 4410-4417.

(Continued)

*Primary Examiner* — Lan Vinh
*Assistant Examiner* — Bradford Gates
(74) *Attorney, Agent, or Firm* — Harness, Dickey & Pierce, P.L.C.

(57) ABSTRACT

A method and apparatus for restoring properties of graphene includes exposing the graphene to plasma having a density in a range from about $0.3*10^8$ cm$^{-3}$ to about $30*10^8$ cm$^{-3}$ when the graphene is in a ground state. The method and apparatus may be used for large-area, low-temperature, high-speed, eco-friendly, and silicon treatment of graphene.

6 Claims, 11 Drawing Sheets

(56) References Cited

U.S. PATENT DOCUMENTS

| | | | |
|---|---|---|---|
| 2007/0212896 A1* | 9/2007 | Olsen | H01J 37/32082 |
| | | | 438/758 |
| 2008/0314318 A1* | 12/2008 | Han | H01J 37/32091 |
| | | | 118/723 R |
| 2010/0301212 A1 | 12/2010 | Dato et al. | |
| 2011/0114499 A1 | 5/2011 | Hori et al. | |
| 2011/0253969 A1 | 10/2011 | Dai et al. | |
| 2012/0132893 A1 | 5/2012 | Heo et al. | |
| 2012/0235118 A1* | 9/2012 | Avouris | H01L 29/518 |
| | | | 257/27 |

FOREIGN PATENT DOCUMENTS

| | | |
|---|---|---|
| KR | 20100110216 A | 10/2010 |
| KR | 20110003104 A | 1/2011 |
| KR | 20110115389 A | 10/2011 |
| KR | 20110133452 A | 12/2011 |
| KR | 20120007998 A | 1/2012 |

OTHER PUBLICATIONS

Ryu, et al. "Atmospheric Oxygen Binding and Hole Doping in Deformed Graphene on a SiO2 Substrate", Nano Letters, vol. 10, pp. 4944-4951 (2010).

Lin, et al. "Graphene Annealing: How Clean Can it Be?", Nano Letters, vol. 12, pp. 414-419, (2012).

Nourbakhsh, et al. "Tuning the Fermi Level of SiO2-Supported Single-Layer Graphene by Thermal Annealing", J. Phys. Chem. C., vol. 114, pp. 6894-6900, (2010).

\* cited by examiner

METHOD AND APPARATUS FOR RESTORING PROPERTIES OF GRAPHENE

CROSS-REFERENCE TO RELATED APPLICATION

This application claims the benefit of Korean Patent Application No. 10-2012-0089736, filed on Aug. 16, 2012, in the Korean Intellectual Property Office, the disclosure of which is incorporated herein in its entirety by reference.

BACKGROUND

1. Field

Example embodiments relate to methods and apparatuses for restoring properties of graphene.

2. Description of the Related Art

Examples of low-order nano substances formed of carbon atoms include fullerene, carbon nanotube, graphene, and graphite. Fullerene is a zero-dimensional structure formed in a ball shape by a hexagonal arrangement of carbon atoms, carbon nanotube is a one-dimensional structure in a roll shape, graphene is a two-dimensional structure of a layer of atoms, and graphite is a three-dimensional structure in a stack shape.

Graphene has stable and desirable electrical/mechanical/chemical characteristics. In addition, graphene has desirable conductivity, and thus, much research has been conducted on developing nano devices including graphene. However, in comparison with silicon in a bulk form, graphene is sensitive to external factors, and thus, its unique structure is easily changed by contact with O, H, or $H_2O$. When used in an electronic device, graphene inevitably comes in contact with a resist residue due to mask patterning. Such contamination of graphene may alter the properties of graphene, e.g., a charge neutrality point, a doping state, carriers (electrons and holes), or conductivity. In this regard, graphene cleaning, e.g., thermal annealing, electrical current annealing, and solvent treatment using chloroform, has been proposed.

However, because thermal annealing is performed slowly at a relatively high temperature from about 200° C. to about 500° C. for about 2 hours to about 4 hours, devices including graphene may be damaged. Moreover, a polymer residue may not be completely removed by thermal annealing. Also, electrical current annealing merely allows local-area annealing of graphene. Furthermore, chloroform treatment is not recommended from an environmental point of view because chloroform is a toxic anesthetic.

SUMMARY

Example embodiments provide methods and apparatuses for restoring properties of graphene, which may be used for a large-area, low-temperature, high-speed, eco-friendly, and silicon treatment of graphene.

According to example embodiments, a method of restoring properties of graphene may include grounding the graphene, and exposing the graphene to plasma having a density in a range from about $0.3*10^8$ cm$^{-3}$ to about $30*10^8$ cm$^{-3}$.

The density may be an ion density, and the graphene may be exposed to the plasma having the ion density in a range from about $1.0*10^8$ cm$^{-3}$ to about $10*10^8$ cm$^{-3}$.

The plasma may be an inductively coupled plasma (ICP), and exposing the graphene may further include adjusting power input to an ICP electrode in order to control the density of the ICP, and exposing the graphene to the ICP.

The plasma may be a pulse plasma, and exposing the graphene may further include adjusting a pulse frequency and a duty cycle of power input to a counter electrode in order to control the density of the pulse plasma, and exposing the graphene to the pulse plasma.

The graphene may be exposed by generating the plasma using an inert gas. The plasma may be generated using an inert gas. The graphene may have properties including at least one of a charge neutrality point, a doping state, carriers, and conductivity.

According to example embodiments, an apparatus for restoring properties of graphene may include an electrode chuck in a treatment container in a ground state, the electrode chuck configured to support the graphene, a plasma electrode configured to generate plasma in the treatment container, and a plasma power source configured to supply power to the plasma electrode, the plasma electrode configured to generate plasma having a density in a range from about $0.3*10^8$ cm$^{-3}$ to about $30*10^8$ cm$^{-3}$.

The density may be an ion density having a range from about $1.0*10^8$ cm$^{-3}$ to about $10*10^8$ cm$^{-3}$. The plasma electrode may be an inductively coupled plasma (ICP) electrode, the plasma may be an ICP, and the density of the plasma may be achieved by adjusting power input to the ICP electrode.

The plasma electrode may be a counter electrode, the plasma may be a pulse plasma and the density of the plasma may be achieved by adjusting a pulse frequency and a duty cycle of power input to the counter electrode.

The plasma may be generated using an inert gas. The properties of the graphene may include at least one of charge neutrality points, a doping state, carriers, and conductivity.

BRIEF DESCRIPTION OF THE DRAWINGS

These and/or other aspects will become apparent and more readily appreciated from the following description of example embodiments, taken in conjunction with the accompanying drawings of which:

FIGS. 5[A]-5[E] are views of an AFM image showing a change of a graphene surface state due to plasma treatment;

DETAILED DESCRIPTION

Reference will now be made in detail to example embodiments, examples of which are illustrated in the accompanying drawings, wherein like reference numerals refer to the like elements throughout. In this regard, example embodiments may have different forms and should not be construed as being limited to the descriptions set forth herein. Accordingly, example embodiments are merely described below, by referring to the figures, to explain aspects of the present description.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

Graphene is a polycyclic aromatic molecule formed of a plurality of carbon atoms connected by common coupling in a six-member ring as a basic repetition unit, or in some cases, in a five-member ring and/or a seven-member ring. As a result, graphene is generally formed as a single layer of common-coupled (generally, $sp^2$ coupled) carbon atoms. The term used herein "graphene" comprehensively refers to graphene including multiple layers as well as graphene including a single layer. Graphene may be manufactured according to well-known methods. For example, a graphene sheet is manufactured and cut into a predetermined or given size for use, or graphene may be grown directly on a substrate for manufacturing.

Figure 1:
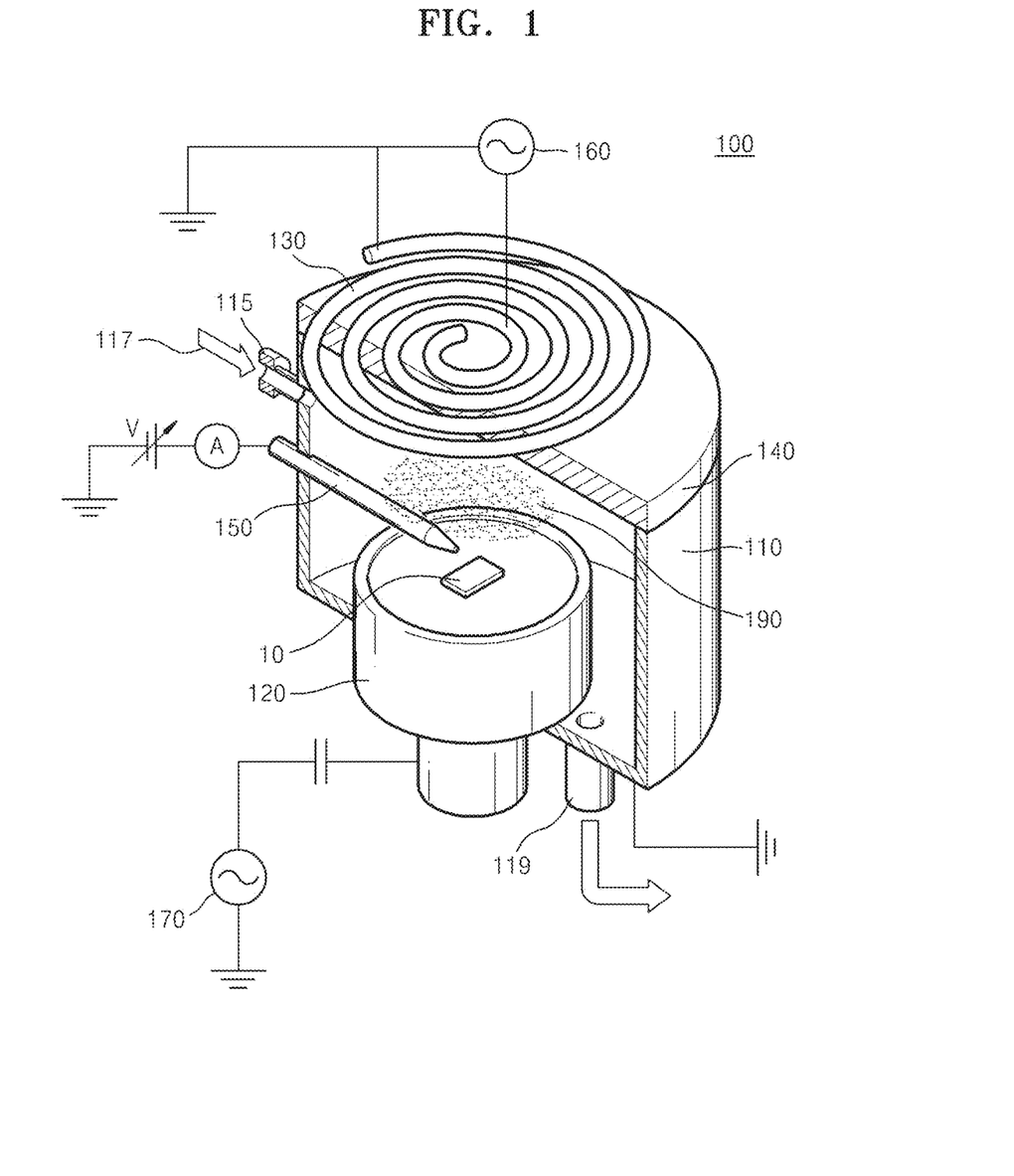
FIG. 1 is a view illustrating an apparatus for restoring properties of graphene according to example embodiments.

FIG. 1 a view illustrating an apparatus 100 for restoring properties of graphene according to example embodiments. Referring to FIG. 1, the apparatus 100 may include a treatment container 110, an electrode chuck 120, an inductively coupled plasma (ICP) electrode 130, and an ICP power source 160. The apparatus 100 according to example embodiments may restore the properties of graphene by using ICP.

The treatment container 110 may be a decompressable vacuum chamber. The treatment container 110 may include a dielectric window 140 in a top area thereof. Also, an inlet 115 and an outlet 119 through which a treatment gas 117 is injected and discharged are provided in the treatment container. The treatment gas 117 may be an inert gas including at least one of argon (Ar), xenon (Xe), and neon (Ne).

The electrode chuck 120 may be disposed in the treatment container 110 to support a graphene 10. The electrode chuck 120 may be maintained in a ground state. The electrode chuck 120 may be connected to a bias power source 170; however, the bias power source 170 does not supply power to the electrode chuck 120.

The ICP electrode 130 may be disposed in the dielectric window 140. The ICP electrode 130 may be a spiral coil as shown in FIG. 1 or other elements. In example embodiments, the ICP 130 and the dielectric window 140 are included in the treatment container 110 in a top area thereof, but the present disclosure is not limited thereto. For example, the ICP electrode 130 and the dielectric window 140 may be provided on a sidewall of the treatment container 110, or the ICP electrode 130 may be provided inside the treatment container 110.

The ICP power source 160 supplies high-frequency power to the ICP electrode 130 to discharge the treatment gas 117 for forming plasma 190. For example, when the treatment gas 117 is an argon (Ar) gas, the ICP power source 160 supplies high-frequency power of about 13.56 MHz. The supplied power may be set such that the density of the plasma generated by the ICP electrode 130 is in a range from about $0.3*10^8$ cm$^{-3}$ to about $30*10^8$ cm$^{-3}$, for example, a range from about $1.0*10^8$ cm$^{-3}$ to about $10*10^8$ cm$^{-3}$.

Figure 2:
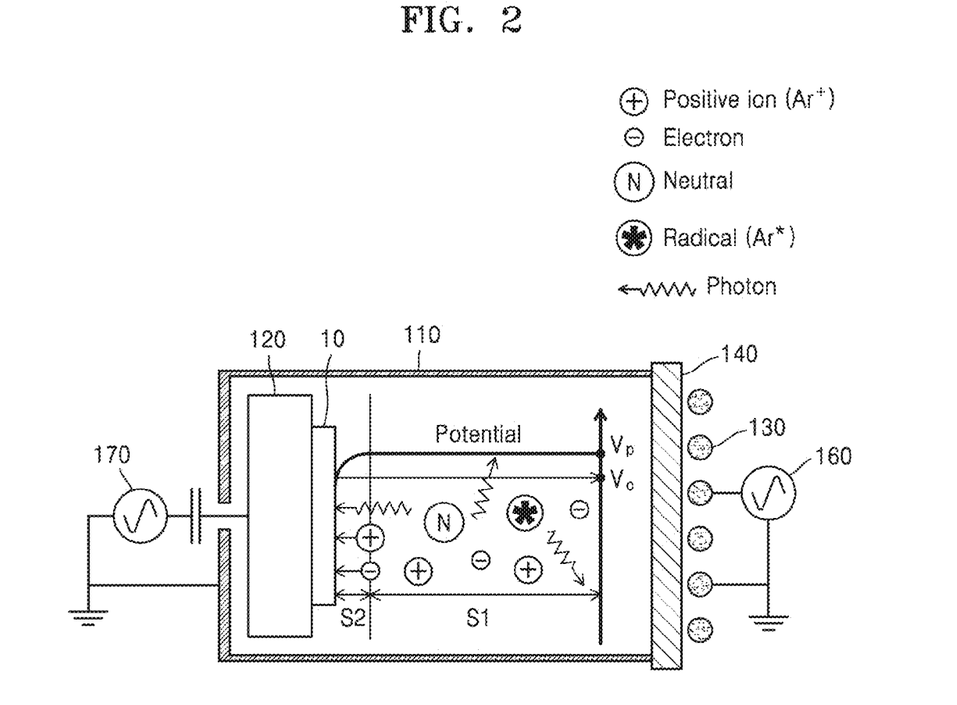
FIG. 2 is a view illustrating an operation of the apparatus shown in FIG. 1.

FIG. 2 is a view illustrating an operation of the apparatus 100 shown in FIG. 1, and FIGS. 3A through 3C are views illustrating a process of restoring properties of graphene by treating contaminated graphene. Referring to FIGS. 2 and 3A through 3C, a method of restoring the properties of graphene by using the apparatus 100 according to example embodiments will be described.

Referring to FIG. 2, when power is supplied to the ICP electrode 130 by using a high-frequency coil from the ICP power source 160, an alternating-current (AC) magnetic field may be generated around the high-frequency coil of the ICP electrode 130 due to a high-frequency electric current flowing through the high-frequency coil of the ICP electrode 130. The AC magnetic field passes through a treatment space in the treatment container 110 through the dielectric window 140. When a temporal change of the AC magnetic field occurs, an induced electric field may be generated in an azimuthal direction in the treatment process, and electrons accelerated in the azimuthal direction due to the induced electric field collide with molecules or atoms of the treatment gas, thereby generating plasma. A region S1 is a plasma-generated region, and a region S2 is a sheath. As is well known, in the region S2, the sheath, electrons are exhausted and thus ionization based on electrons hardly occurs. Because the electrode chuck 120 on which graphene 10 is placed is grounded, a potential of the electrode chuck 120 is about 0V. In a state where no power is supplied to the electrode chuck 120 and low-density ICP is generated, plasma ions (e.g., $Ar^+$) and electrons reach the graphene 10.

Figure 3A:
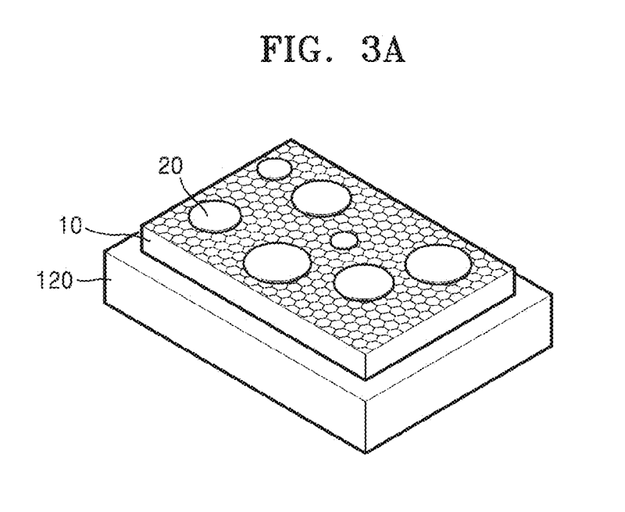
FIGS. 3A through 3C are views illustrating a process of restoring properties of graphene by treating contaminated graphene.

FIG. 3A shows a case where the graphene 10 is contaminated by a contaminant 20. It is considered that the graphene 10 is sensitive to external factors, and thus, may be more easily contaminated by the contaminant 20. As an example of contamination, for large-area graphene produced by chemical vapor deposition (CVD), polymethylmetacrylate (PMMA) is used as a handle layer, and thus, a residue polymer may be generated. Moreover, coupling is likely to be generated between graphene and a substance, e.g., O, H, or $H_2O$, or the carbon coupling structure of the graphene may be deformed. Furthermore, when graphene is used in a device, a resist residue generated during manufacturing may remain in the graphene. Due to such contamination or deformation of the carbon coupling structures, the properties of the graphene 10, e.g., a charge neutrality point, a doping state, carriers (electrons and holes), or conductivity, may be changed.

Figure 3B:
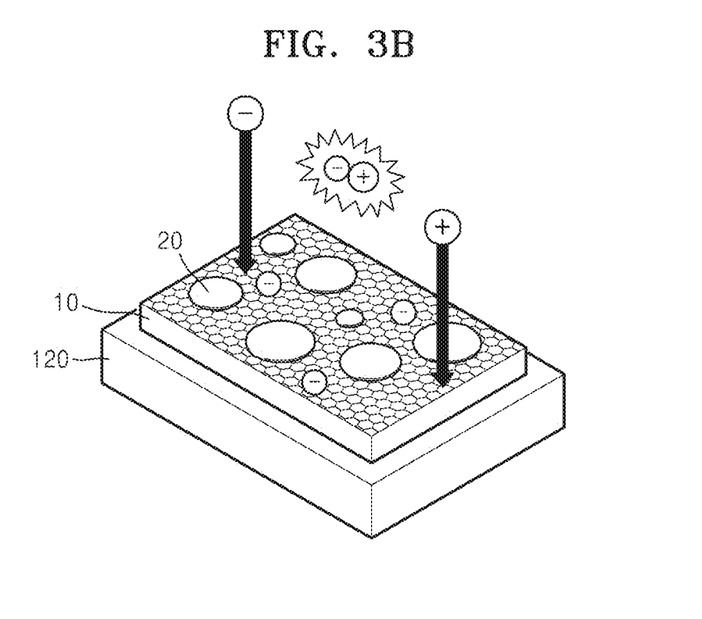
Figure 3C:
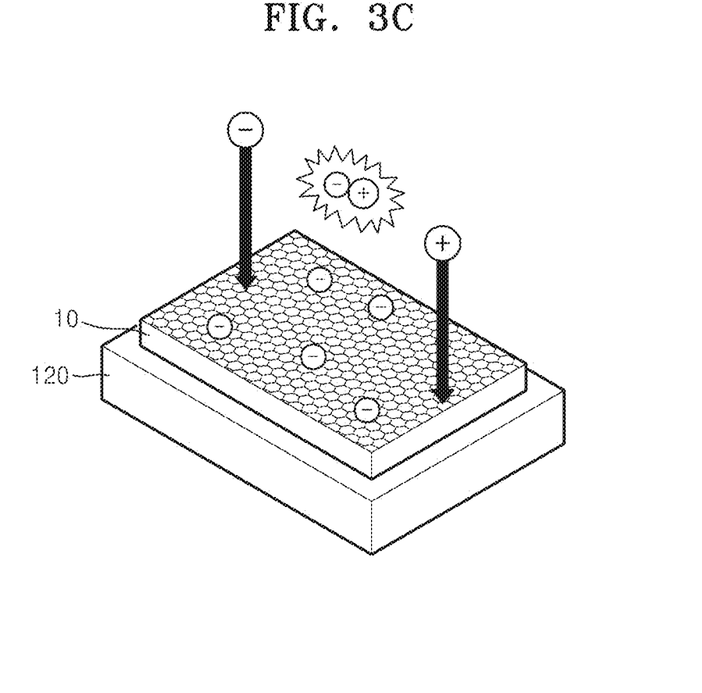

FIG. 3B shows an intermediate state during treatment of the graphene 10 with low-density plasma, and FIG. 3C shows a state after treatment of the graphene 10 with low-density plasma for a predetermined or given time. General plasma treatment apparatus uses high-density plasma to remove the contaminant 20 attached to the graphene 10, but also destructs the carbon coupling structure of the graphene 10. The general plasma treatment apparatus may destruct the carbon coupling structure of the graphene 10 because a bias voltage is applied to the electrode chuck 120, and thus, power is supplied to the graphene 10 in a plasma treatment process. On the other hand, in example embodiments, the graphene 10 is treated with low-density plasma while the ground state of the electrode chuck 120 is being maintained without applying a bias voltage to the electrode chuck 120, thereby preventing or reducing damage of the carbon coupling structure of the graphene 10 due to plasma and also restoring the properties of the graphene 10 into a non-contaminated state. This may be seen from the experimental data provided below.

Figure 4:
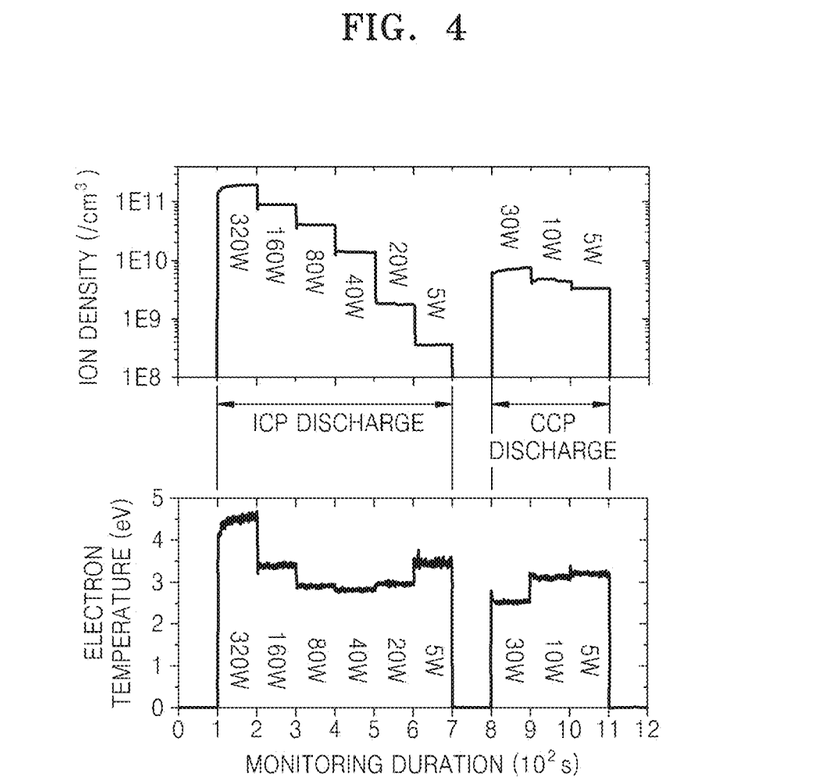
FIG. 4 is a graphical view illustrating an example of a density of plasma ions and a temperature of electrons in the apparatus for restoring properties of graphene shown in FIG. 1.

FIG. 4 is a graphical view illustrating a density of plasma ions and a temperature of electrons in the apparatus 100 according to example embodiments. To measure the density of plasma ions and the temperature of electrons, a Langmuir probe 150 (see FIG. 1) capable of performing real-time measurement is used. As a comparative example, a case where power is supplied to the electrode chuck 120 in the apparatus 100 and the bias power source 170 (see FIG. 1) is connected to the electrode chuck 120 is considered.

An ICP discharge case will be described. In example embodiments, the bias power source 170 does not supply power to the electrode chuck 120, and the electrode chuck 120 is maintained in a ground state. Referring to FIG. 4, the density of plasma ions is proportional to the power supplied to the ICP electrode 130 from the ICP power source 160. In particular, when the power from the ICP power source 160 is 5 W, an ICP having a relatively low ion density of about $3.5*10^8$ $cm^{-3}$ is formed. As the power input through the ICP power source 160 gradually increases from 5 W, the ion density also increases, and when the power reaches about 40 W, an ICP having a relatively high ion density of about $10^{10}$ $cm^{-3}$ is formed.

At a power of 5 W, the temperature of electrons is about 3.5 eV. Generally, when the electron temperature of plasma is from about 1 eV to about 5 eV, plasma treatment is possible, and even at the low power of 5 W, the apparatus 100 according to example embodiments may operate normally.

A capacitively coupled plasma (CCP) discharge case will be described. In example embodiments, power is not supplied from the ICP power source 160. Referring to FIG. 4, when power is supplied to the electrode chuck 120, a CCP is formed, and even at a low power of about 5 W, plasma having a high density of about $3*10^9$ $cm^{-3}$ or higher is formed. As the CCP has relatively high density even at relatively low power, defects may be caused in graphene, rather than restoring the properties of graphene as will be mentioned in the following description with reference to FIG. 10. Therefore, the apparatus 100 according to example embodiments maintains the ground state of the electrode chuck 120 without supplying power to the electrode chuck 120.

Figure 5:
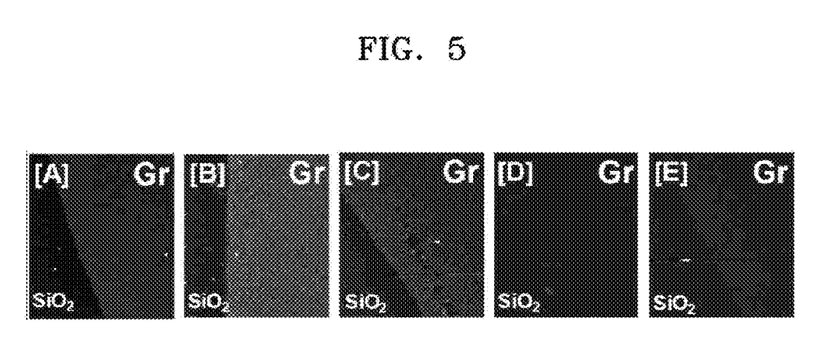

FIGS. 5[A]-5[E] are views of an atomic force microscopy (AFM) image showing a change of a graphene surface state due to plasma treatment. In FIG. 5, A is an image of pristine graphene which is not contaminated, B is an image of a graphene-ferroelectric effect transistor (G-FET) from which a contaminant is not completely removed, C is an image after ICP treatment of the G-FET for 81 seconds when the power of the ICP power source 160 is 5 W, D is an image after ICP treatment of the G-FET for 162 seconds when the power of the ICP power source 160 is 5 W, and E is an image after ICP treatment of the G-FET for 486 seconds when the power of the ICP power source 160 is 5 W. In FIG. 5, Gr indicates graphene. Referring to FIG. 5, after 162 seconds, the contaminant is completely removed, and thus, graphene becomes clean.

Figure 6:
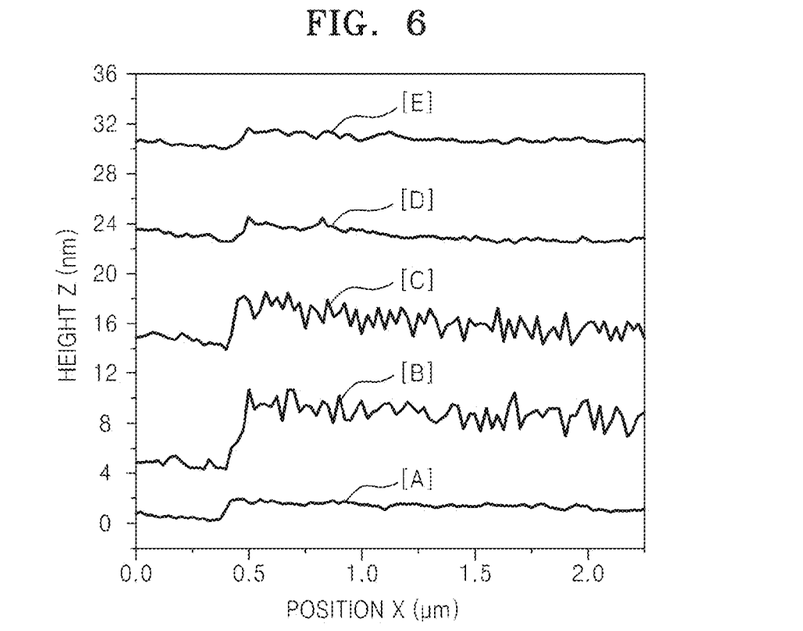
FIGS. 6 and 7 are graphical views illustrating changes of a graphene surface state corresponding to A, B, C, D, and E in FIG. 5.
Figure 7:
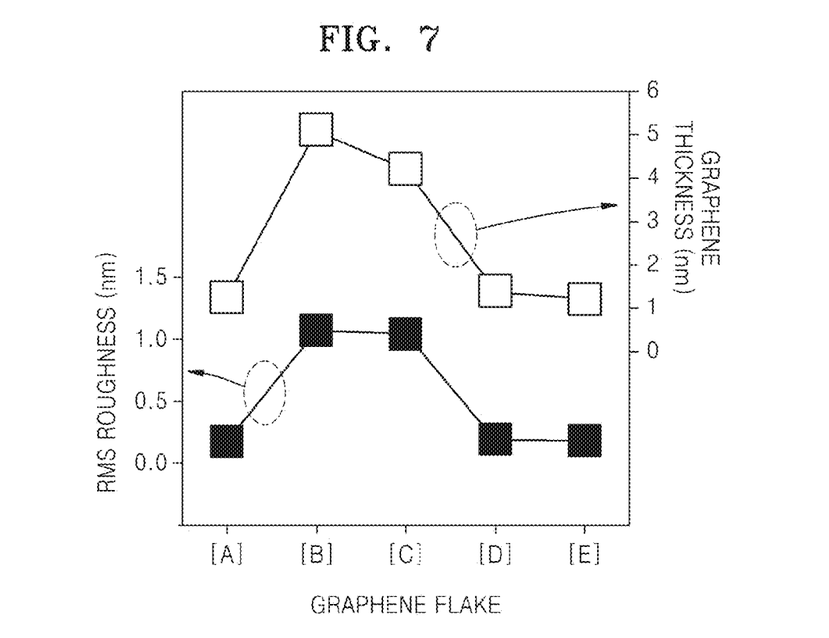

FIG. 6 is a graphical view illustrating profile changes of graphene surfaces corresponding to A, B, C, D, and E in FIG. 5, and FIG. 7 is a graphical view illustrating changes of RMS roughness and thickness of graphene surfaces corresponding to A, B, C, D, and E in FIG. 5. In FIG. 6, graphene is placed at position X past about 0.5 μm.

It can be seen from FIGS. 6 and 7 that B or C shows a relatively high change in the height (Z) and a relatively rough surface of graphene, because a resist residue still remains in graphene during manufacturing of the G-FET. It can also be seen that A, D, and E show a relatively small change in the height Z and a relatively low surface roughness of graphene. That is, cleaning of graphene has already been completed when the ICP treatment has been performed for 162 seconds, and the height and surface roughness of graphene hardly change even if the ICP treatment is further continued after that.

Figure 8A:
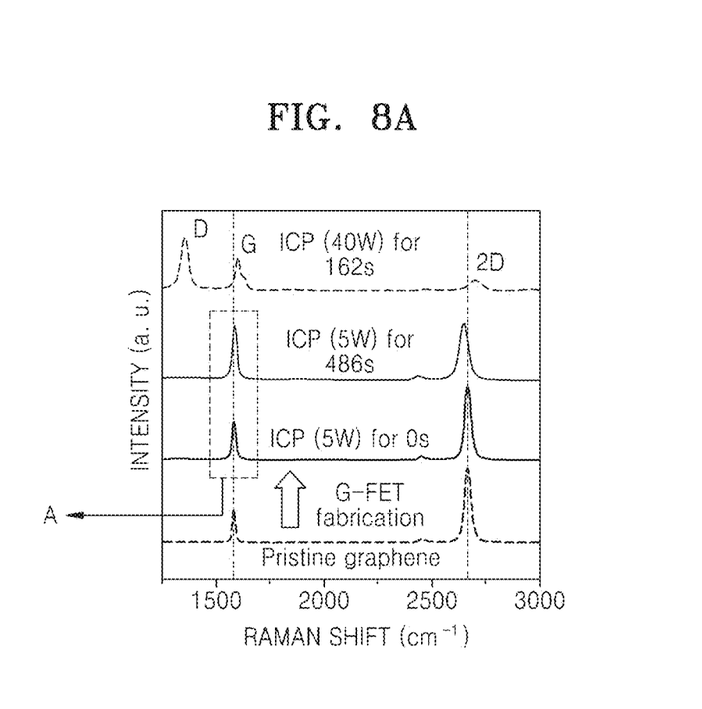
FIG. 8A is a graphical view of Raman spectrum graph of graphene according to setting of plasma treatment.
Figure 8B:
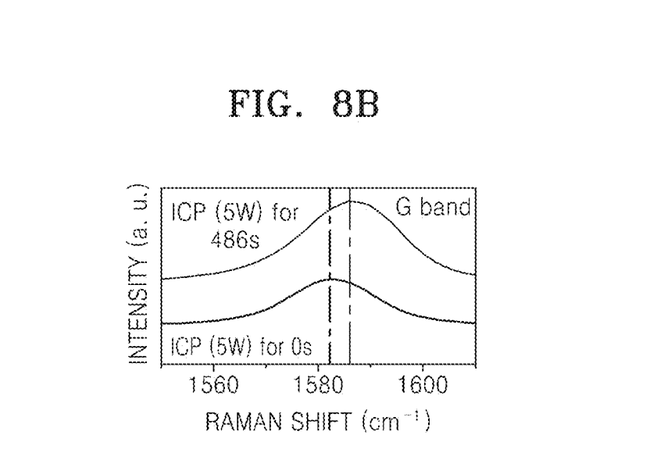
FIG. 8B is a graphical view illustrating in detail region A of a band region G in FIG. 8A.

FIG. 8A is a graphical view Raman spectrum of graphene according to a setting of plasma treatment, and FIG. 8B is a graphical view of in detail region A of a band region G in FIG. 8A.

Referring to FIG. 8A, when ICP treatment is performed for 486 seconds when the power of the ICP power source 160 is about 5 W, a band D (about 1350 $cm^{-1}$) is not detected. However, when ICP treatment is performed for 162 seconds while the power of the ICP power source 160 is 40 W, the band D is confirmed. This means that graphene is damaged in ICP treatment when the power of the ICP power source 160 is about 40 W, but no defects occur in graphene when the power of the ICP power source 160 is about 5 W.

As is apparent from FIG. 8B, a G-peak is up-shifted by 4 cm$^{-1}$ and a 2D-peak is down-shifted by about 12 cm$^{-1}$ after ICP treatment for 486 seconds when the power of the ICP power source 160 is about 5 W. This means that n-doping occurs due to a current density ($J_e$) input to graphene after ICP treatment.

An example of using the graphene property restoring method according to example embodiments in relation to a device including graphene will be described.

Figure 9:
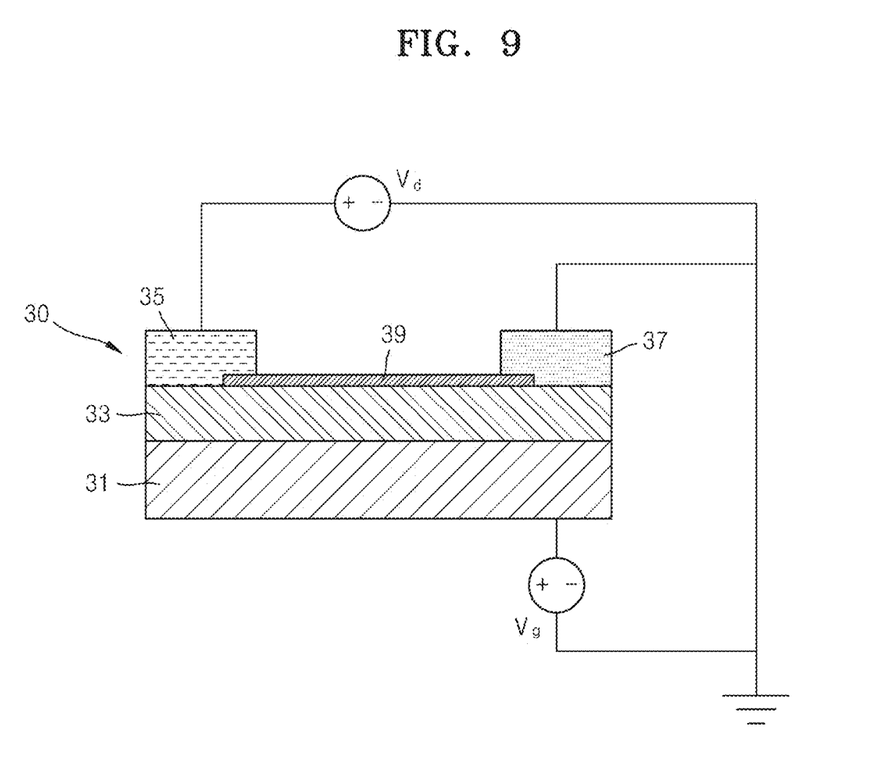
FIG. 9 is a view illustrating G-FET which is an example of a graphene device.

FIG. 9 a view illustrating a G-FET 30 which is an example of a graphene device, and FIGS. 10 through 13 are graphical views illustrating current-voltage characteristics of the G-FET 30 after the G-FET 30 shown in FIG. 9 is treated using the graphene property restoring method according to example embodiments.

Referring to FIG. 9, the G-FET 30 may include a gate 31 composed of p-type silicon (p-Si), an insulating layer 33 formed of silicon oxide (SiO$_2$) on the gate 31, graphene 39 formed on the insulating layer 33, and source and drain electrodes 35 and 37 provided at both ends of the graphene 39. The gate 31 may function as a gate electrode, and the graphene 39 may function as a channel layer. The graphene 39 may be formed by chemical vapor deposition (CVD) and then transferred onto the insulating layer 33 by a lift-off scheme, or may be formed directly on the insulating layer 33. However, a material used as a handle layer in graphene formation, e.g., PMMA, may not be completely removed by acetone, and thus, a residue may be generated, and accordingly, the properties of the graphene 39 may be deteriorated.

Figure 10:
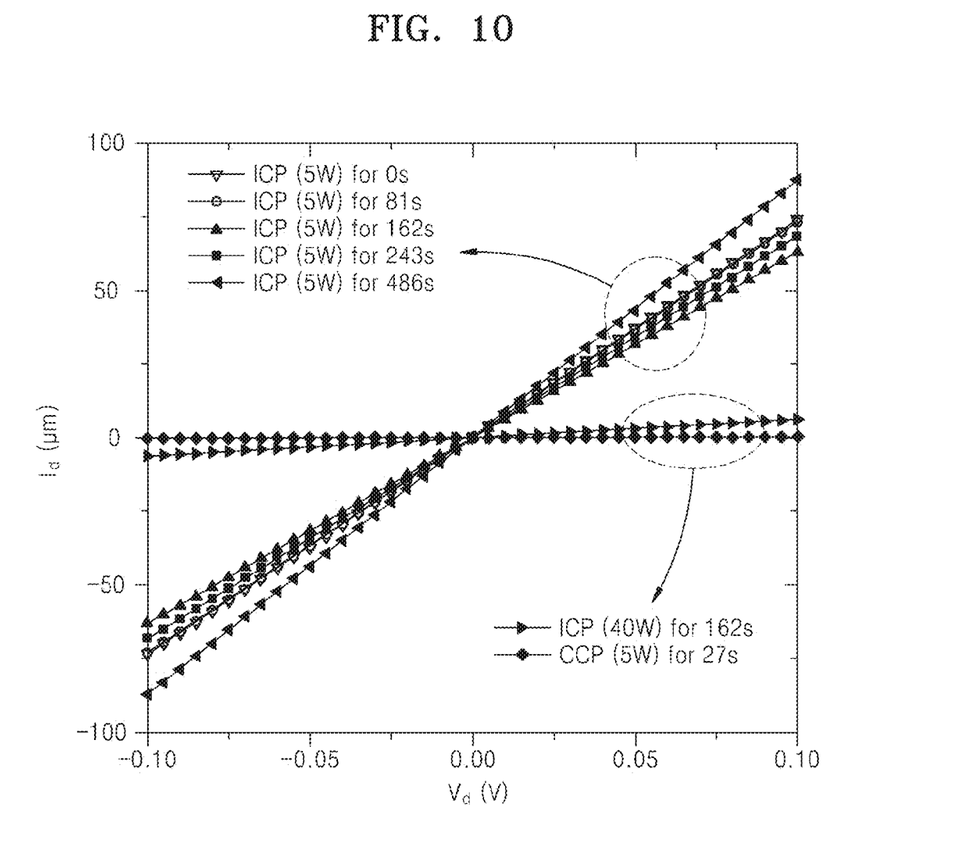
FIGS. 10 through 13 are graphical views illustrating current-voltage characteristics of G-FET after treatment of G-FET of FIG. 9 via a method of restoring properties of graphene according to example embodiments.

FIG. 10 shows drain-side current-voltage characteristics when a gate voltage $V_g$ applied to the gate 31 of the G-FET 30 is about 0 V. The graphene 39, which is exposed for 27 seconds to CCP when the power supplied to the ICP electrode 130 is about 5 W, is almost destructed, and thus, its conduction level is about 0. When the graphene 39 is exposed to ICP when the power supplied to the ICP electrode 130 is about 40 W, the conduction level of the graphene 39 is also largely reduced. On the other hand, when the graphene 39 is exposed to ICP when the power supplied to the ICP electrode 130 is about 5 W, the conduction level of the graphene 39 changes such that the G-FET 30 of the graphene 39 functions as a channel layer. The conduction level change of the graphene 39 occurs due to a shift of $V_{dirac}$ as can be seen from Raman spectra of FIGS. 8A and 8B.

Figure 11:
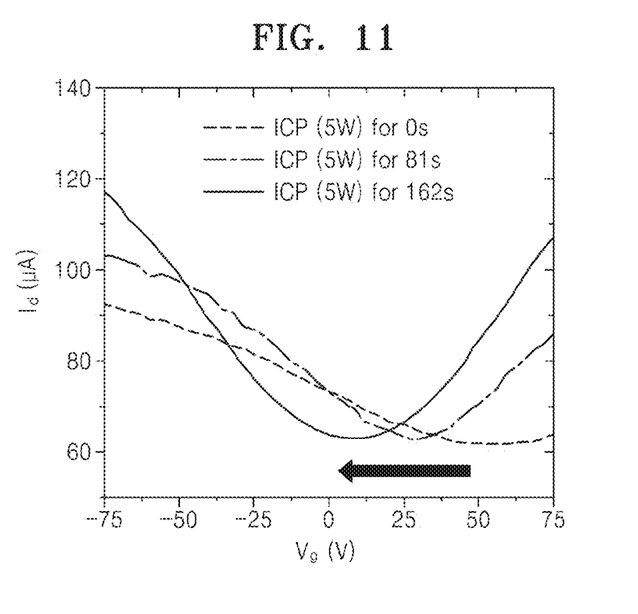

Referring to FIG. 11, it can be seen that a curve of $I_d$-$V_g$ changes after ICP treatment when the power supplied to the ICP electrode 130 is about 5 W. $V_{dirac}$, which is the bottom of each curve, is shifted from about 56 V to about 8 V as the ICP treatment is performed from about 0 second to about 162 seconds. Table 1 shows the carrier mobility.

TABLE 1

| | Hole Mobility (cm$^2$/Vs) | Electron Mobility (cm$^2$/Vs) |
|---|---|---|
| ICP (5 W) for 0 s | 1570 | 1550 |
| ICP (5 W) for 81 s | 3140 | 3120 |
| ICP (5 W) for 162 s | 4160 | 4080 |

It can be seen from Table 1 that the electron mobility increases from about 1550 cm$^2$/Vs to about 4080 cm$^2$/Vs and the hole mobility increases from about 1570 cm$^2$/Vs to about 4160 cm$^2$/Vs.

Figure 12:
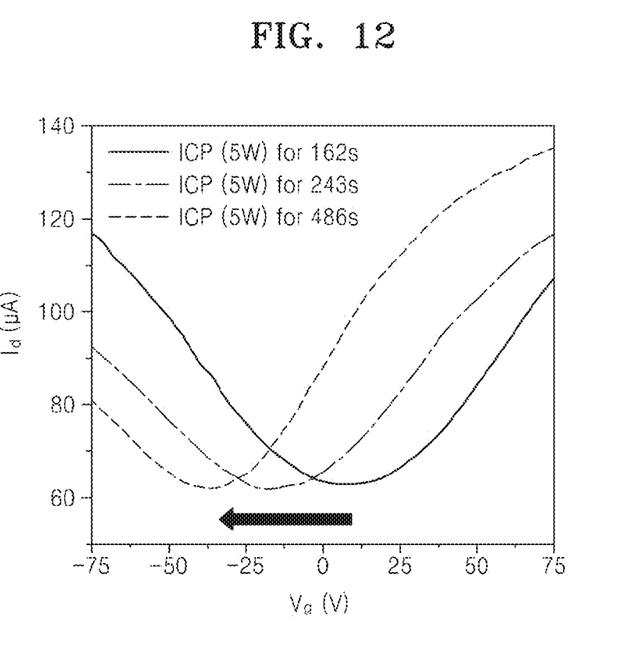
Figure 13:
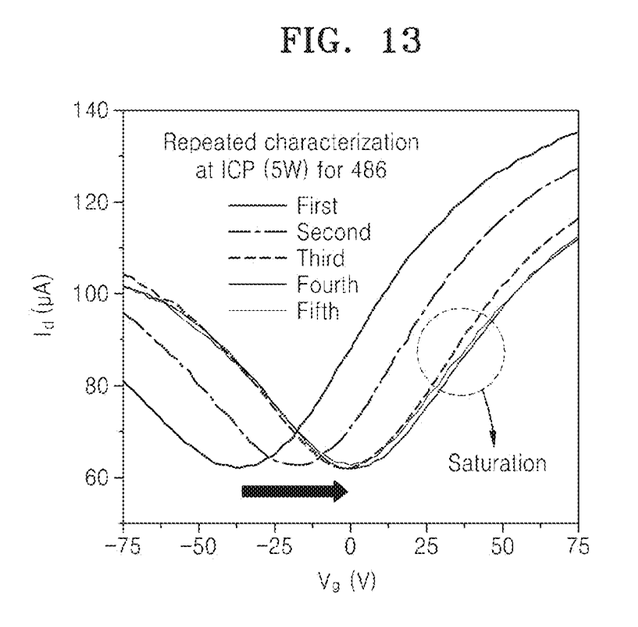

Referring to FIG. 12, when the ICP treatment continues from about 162 seconds to about 486 seconds point, $V_{dirac}$ is shifted from about 8 V to—about 37 V. Temporary n-doping may occur due to current density ($J_e$) input to the graphene 39. However, referring to FIG. 13, when the electric measurement is repeated when the ICP treatment has been performed for 486 s, the graphene 39 is restored to a neutral state. That is, in FIG. 12, a shift of $V_{dirac}$ corresponding to ICP treatment is restored to the original state when the electric measurement is repeated after the ICP treatment.

Figure 14:
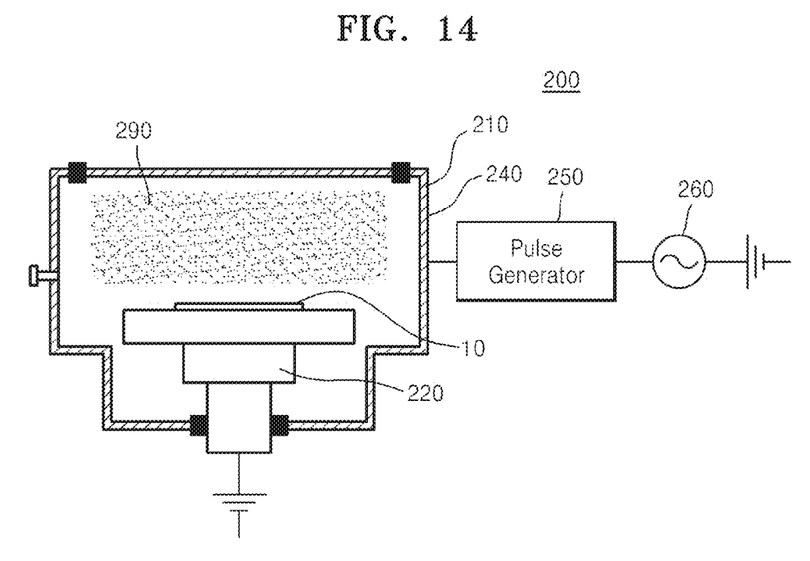
FIG. 14 shows an apparatus 200 for restoring properties of graphene according to example embodiments.

FIG. 14 shows an apparatus 200 for restoring properties of graphene according to example embodiments.

The apparatus 200 according to example embodiments may include a treatment container 210, an electrode chuck 220, and a power unit including a pulse generator 250. The electrode chuck 220 may function as a working electrode, and a sidewall of the treatment container 210 may function as a counter electrode 240. In some example embodiments, a top portion of the treatment container 210 may function as a counter electrode.

Graphene 10, which is to be treated, may be disposed on the electrode chuck 220. In example embodiments, the electrode chuck 220 is in a ground state.

Pulsed power is input to the counter electrode 240. The pulsed power may be supplied by mounting the pulse generator 250 on a bias power source 260 which supplies high-frequency power of about 13.56 MHz. By adjusting a pulse-frequency and a duty cycle, plasma 290 with lower density than conventional plasma can be formed. That is, by supplying pulsed power, the number of times plasma is generated is reduced, and thus, a low-density plasma may be obtained. For example, pulsed power supplied from the pulse generator 250 is set to satisfy pulse conditions, e.g., a frequency from about 50 Hz to about 500 Hz and a duty range from about 20% to about 99%, such that the density of plasma generated by the ICP electrode 130 may be in a range from about 0.3*10$^8$ cm$^{-3}$ to about 30*10$^8$ cm$^{-3}$, for example, in a range from about 1.0*10$^8$ cm$^{-3}$ to about 10*10$^8$ cm$^{-3}$.

The apparatus 200 according to example embodiments operates substantially the same as the apparatus 100 according to example embodiments in a sense that the electrode chuck 220 having the graphene 10 mounted thereon is in a ground state and low-density plasma is supplied thereto.

The apparatus 200 according to example embodiments generates pulse plasma by supplying pulsed power to the counter electrode 240, but low-density plasma may also be obtained by supplying pulsed power to an ICP electrode of an ICP treatment device.

The methods and apparatuses for restoring the properties of graphene according to example embodiments may be used for a large-area, low-temperature, high-speed, eco-friendly, and silicon treatment of graphene. For example, the methods and apparatuses according to example embodiments are compatible with silicon treatment of graphene when compared to thermal annealing, are capable of high-speed and low-temperature treatment of graphene, and are compatible with silicon treatment of graphene when compared to electrical current annealing. The methods and apparatuses according to example embodiments are also capable of large-area treatment of graphene, are compatible with silicon treatment of graphene when compared to chemical treatment, and provide an eco-friendly treatment of graphene.

It should be understood that example embodiments described therein should be considered in a descriptive sense only and not for purposes of limitation. Descriptions of features or aspects within each embodiment should typically be considered as available for other similar features or aspects in other example embodiments.

What is claimed is:

1. A method of restoring properties of graphene, the method comprising:
   grounding the graphene; and
   exposing the graphene to plasma having a density in a range from about $0.3*10^8$ cm$^{-3}$ to about $30*10^8$ cm$^{-3}$.

2. The method of claim 1, wherein the density is an ion density, and exposing the graphene includes exposing the graphene to the plasma having the ion density in a range from about $1.0*10^8$ cm$^{-3}$ to about $10*10^8$ cm$^{-3}$.

3. The method of claim 1, wherein the plasma is an inductively coupled plasma (ICP), and the exposing the graphene further comprises:
   adjusting power input to an ICP electrode in order to control the density of the ICP; and
   exposing the graphene to the ICP.

4. The method of claim 1, wherein the plasma is a pulse plasma, and the exposing the graphene further comprises:
   adjusting a pulse frequency and a duty cycle of power input to a counter electrode in order to control the density of the pulse plasma; and
   exposing the graphene to the pulse plasma.

5. The method of claim 1, wherein the exposing the graphene includes generating the plasma using an inert gas.

6. The method of claim 1, wherein the exposing the graphene includes exposing the graphene having properties including at least one of a charge neutrality point, a doping state, carriers, and conductivity.

* * * * *